(12) United States Patent  
Yazawa

(10) Patent No.: US 7,683,479 B2
(45) Date of Patent: Mar. 23, 2010

(54) SEMICONDUCTOR PACKAGE INVOLVING A ROTARY LOCK THAT CONNECTS A PACKAGE SUBSTRATE AND A SEPARATE COMPONENT

(75) Inventor: Kazuaki Yazawa, Chiba (JP)

(73) Assignee: Sony Computer Entertainment Inc., Tokyo (JP)

( * ) Notice: Subject to any disclaimer, the term of this patent is extended or adjusted under 35 U.S.C. 154(b) by 61 days.

(21) Appl. No.: 11/529,659

(22) Filed: Sep. 28, 2006

(65) Prior Publication Data

US 2007/0080471 A1 Apr. 12, 2007

(30) Foreign Application Priority Data

Oct. 12, 2005 (JP) ............................. 2005-297672

(51) Int. Cl.
*H01L 23/34* (2006.01)
*H01L 23/06* (2006.01)
*H01L 23/12* (2006.01)
*H01L 23/28* (2006.01)
*H01L 23/10* (2006.01)

(52) U.S. Cl. ............... 257/727; 257/712; 257/E23.083; 257/719; 257/718; 257/E23.084; 257/684; 257/731; 257/787; 257/E23.133; 257/E23.129; 257/E23.187; 257/E23.14; 257/730; 257/707; 257/704; 257/706

(58) Field of Classification Search ........... 257/719, 257/E23.083, E23.084, 787, E23.133, E23.129, 257/E23.187, E23.14, 727, 730, 707, 704, 257/706, 712, 718, 684, 731

See application file for complete search history.

(56) References Cited

U.S. PATENT DOCUMENTS 5,789,813 A * 8/1998 Kirkland et al. ............. 257/712

(Continued)

FOREIGN PATENT DOCUMENTS

JP 08-046100 2/1996

(Continued)

OTHER PUBLICATIONS

Chinese Office Action for Corresponding Application No. 200610136115.9.

(Continued)

*Primary Examiner*—Phat X Cao
*Assistant Examiner*—Diana C Garrity
(74) *Attorney, Agent, or Firm*—Matthew B. Dernier, Esq.; Gibson & Dernier LLP

(57) ABSTRACT

A semiconductor chip 36 is mounted on a package substrate 30 with its circuit side facing to a board 38. Heat is dissipated from an upper side of the semiconductor chip 36 opposite to the circuit side. A sealing resin 32 seals around the periphery of the semiconductor chip 36 so that the upper side of the semiconductor chip 36 is exposed to atmosphere. A fixing member 34 is buried in the sealing resin 32 so that a hook 40 formed on the tip of the fixing member 34 extends above the upper side of the semiconductor chip 36. A spreader 10 dissipates heat emitted from the semiconductor chip 36. A guiding slot 12 is formed on the side facing to the package substrate 30 of the spreader 10. The hooks 40 of the fixing members 34 are inserted into the guiding slots 12 respectively, and then the spreader 10 is rotated by predetermined angle against the package substrate 30. Then, the hooks 40 travel along the slots 12. Through such process, the spreader 10 is pulled to come into contact with the upper side of the semiconductor chip 36.

14 Claims, 10 Drawing Sheets

U.S. PATENT DOCUMENTS 5,949,137 A 9/1999 Domadia
2002/0066952 A1* 6/2002 Taniguchi et al. ........... 257/698

FOREIGN PATENT DOCUMENTS

JP 10242355 A 9/1998
JP 200031355 A 1/2000

OTHER PUBLICATIONS

Chinese Office Action for Corresponding Application No. 200610136115.9, dated Nov. 28, 2008.

* cited by examiner

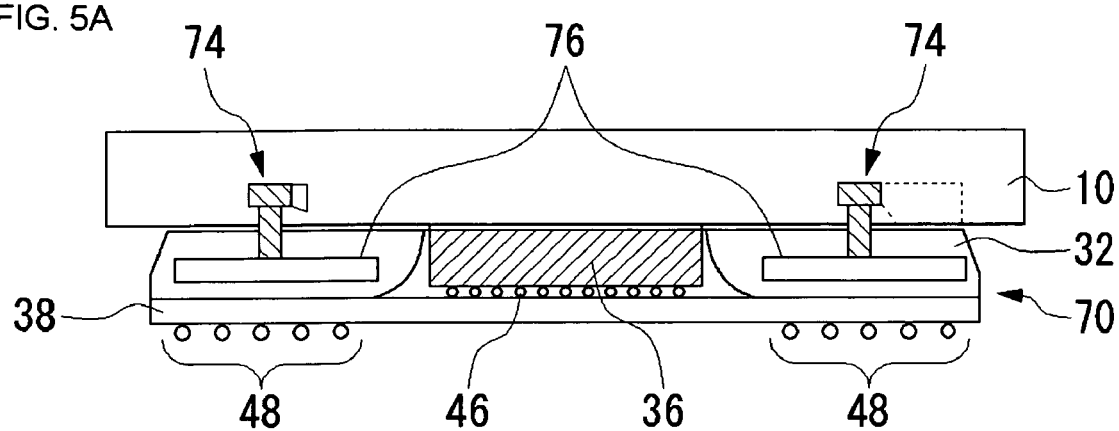
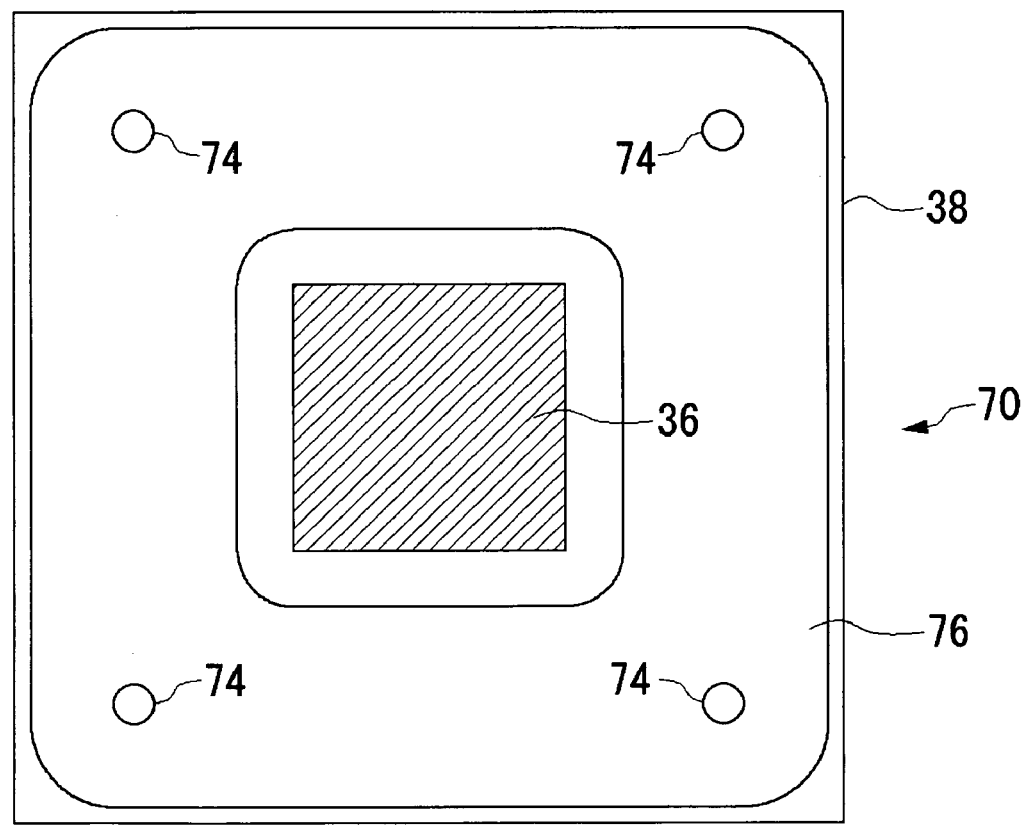

SEMICONDUCTOR PACKAGE INVOLVING A ROTARY LOCK THAT CONNECTS A PACKAGE SUBSTRATE AND A SEPARATE COMPONENT

BACKGROUND OF THE INVENTION

1. Field of the Invention

The present invention relates to technology for attaching a heat radiator or the like to a package substrate.

2. Description of the Related Art

Various types of semiconductor chips, such as a CPU (Central Processing Unit) and a DSP (Digital Signal Processor), which controls electronic equipments, are constructed of various electronic components including active elements, such as transistors and passive elements, such as capacitors. Part of electric energy for driving these electronic components is converted into thermal energy and dissipated as heat. The performance of the electronic components typically has temperature dependence. Then, the dissipated heat has an inverse effect on the performance of the electronic components, and by extension that of the semiconductor chips. Thus, technologies for cooling the semiconductor chips are of significant importance in controlling the electronic devices properly.

To cool the semiconductor chips, some conventional arts provide a heat radiator, such as a heat sink on the semiconductor chip, which is disclosed in Japanese Patent Laid-Open No. 8-46100. Heat emitted from the semiconductor chip is transferred to the heat radiator, and the heat is dissipated from the heat exchange surface of the heat radiator. Typically, the heat radiator is designed to have large heat exchange surface so as to transfer the heat from the semiconductor chip to cool fluid or gas surrounding the semiconductor chip efficiently. In order to cool the semiconductor chip regularly, it is necessary to equalize the heat resistance between the heat radiator and the semiconductor chip by pressurizing the heat radiator against the semiconductor chip.

In the conventional art, a back plate is attached on a back side of the package substrate to prevent deformation of the package substrate, thereby equalizing the heat resistance between the heat radiator and the semiconductor chip. Thus, stable cooling with the heat radiator is realized. However, this method increases the number of components and tasks for assembling the semiconductor device. Furthermore, increasing the area of the heat exchange face of the heat radiator makes the attachment of the heat radiator on the package substrate more difficult.

SUMMARY OF THE INVENTION

It is an object of the present invention to provide technology for attaching a component, such as the heat radiator to the package substrate equipped with the semiconductor chip.

One aspect of the invention provides a semiconductor device. The device comprises a package substrate equipped with a semiconductor chip thereon, and a sealing resin formed on the package substrate for sealing around the periphery of the semiconductor chip. The device further comprises a fixing member for fixing a separate component on the side of the package substrate where the semiconductor chip is equipped, so that the semiconductor chip is pressed between the package substrate and the separate component, wherein one end of the fixing member is buried in the sealing resin.

According to this aspect, the fixing member is provided on the package substrate. Thus, any of appropriate part can be easily attached to the package substrate using the fixing member.

The device may comprise a stiffening plate buried in the sealing resin to surround the periphery of the semiconductor chip. The thickness of the stiffening plate is preferably thinner than that of the semiconductor chip. The fixing member may be joined to the stiffening plate. According to this aspect, in case that a heavy component or a component larger than the substrate is attached to the package substrate, deformation of the package substrate due to such component is decreased by the stiffening plate.

The semiconductor chip may be put on the package substrate with its circuit side facing the package substrate, wherein heat is dissipated from its upper side opposite to the circuit side. The sealing resin may seal around the periphery of the semiconductor chip so that the upper side of the semiconductor chip is exposed to the atmosphere. According to this aspect, the heat radiator makes contact with a flip-chip implemented semiconductor chip. Therefore, heat may be directly radiated from the upper side of the semiconductor chip, thereby improving heat radiation efficiency.

Part of the fixing member may be buried in the sealing resin so that a hook formed on the tip of the fixing member extends above the upper side of the semiconductor chip. The separate component may comprise a rotary locking structure, wherein a guiding slot is formed on the side facing to the package substrate of the separate component, the hook of the fixing member is inserted into the guiding slot, then the separate component is rotated by predetermined angle against the package substrate, the hook traveling along the guiding slot, thereby the separate component being pulled to come into contact with the upper side of the semiconductor chip. Using this rotary locking structure, the separate component may be easily and reliably attached to the package substrate.

The fixing member may be formed so as to receive a joint member to fix the separate component to the package substrate. The joint member extends through a hole formed in the separate component. The separate component may be a heat radiator to dissipate heat emitted from the semiconductor chip.

Another aspect of the invention also provides a semiconductor device. The device comprises a package substrate equipped with a semiconductor chip thereon, and an implementation substrate equipped with the package substrate thereon. The device further comprise a fixing member for fixing a separate component on the side of the package substrate where the semiconductor chip is equipped, so that the semiconductor chip is pressed between the package substrate and the separate component, wherein the fixing member is arranged on the implementation substrate.

In addition, the embodiments of the present invention expressed in the above-mentioned combinations of components apply in the context of methods, devices, and systems in the context of further aspects of the invention.

BRIEF DESCRIPTION OF THE DRAWINGS

FIG. 5A is a cross-sectional view of the spreader and the package substrate with a stiffening plate buried in a sealing resin when they are joined together;

FIG. 5B is a plane view of the package substrate with the spreader removed from the substrate shown in FIG. 5A;

DETAILED DESCRIPTION OF THE INVENTION

The invention will now be described by reference to the preferred embodiments. This does not intend to limit the scope of the present invention, but to exemplify the invention.

Figure 1A:
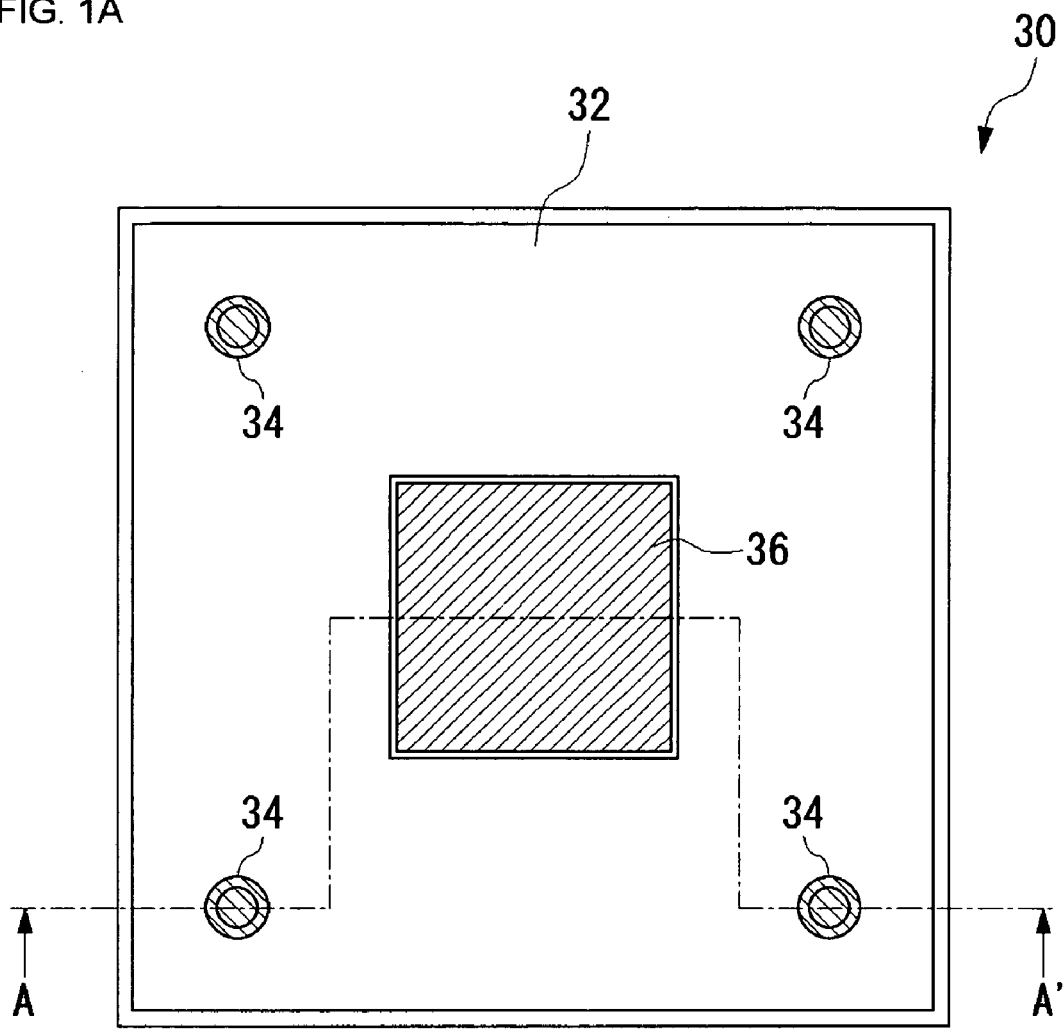
FIG. 1A is a plane view of a package substrate according to one embodiment of the invention.
Figure 1B:
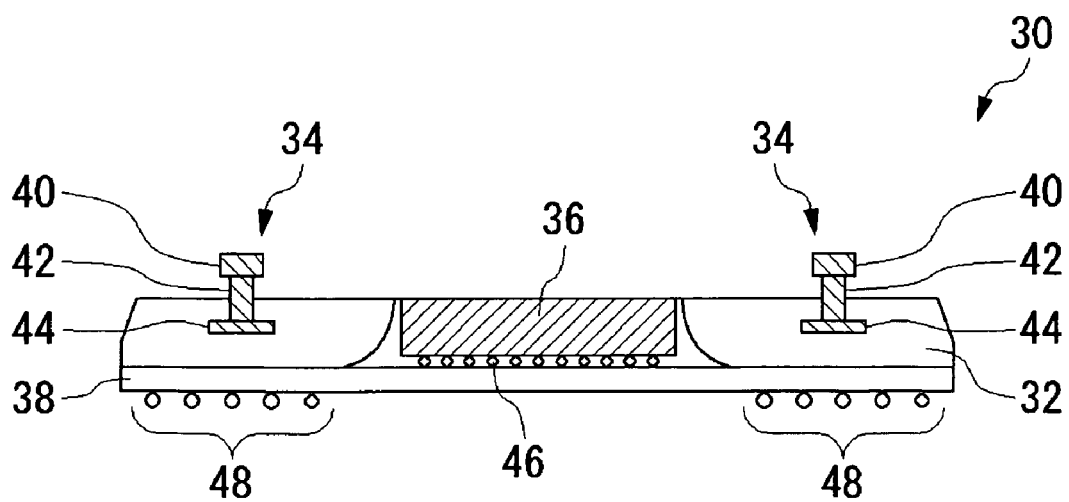
FIG. 1B is a cross-sectional view along line A-A' of the package substrate in FIG. 1A.

FIG. 1A is a plane view of a package substrate 30 according to one embodiment of the invention. FIG. 1B is a cross-sectional view along line A-A' of the package substrate in FIG. 1A. The package substrate 30 comprises a board 38, a semiconductor chip 36 flip-chip implemented on the board 38, and a sealing resin 32 sealing around the periphery of the semiconductor chip 36.

The board 38 has multilayered wiring structure that insulating films and wiring layers are laminated alternately. On each of ball land areas (not shown) formed on the back side of the board 38, a BGA ball 48 is placed respectively. The package substrate 30 serves as an intermediate plate to mount the semiconductor chip 36 on an implementation substrate. On the side where the semiconductor chip 36 is equipped on the board 38, electrode pads (not shown) are arranged in the form of array. On the electrode pads, C4 (Controlled Collapse Chip Connection) bumps 46 are provided respectively. C4 bump is made of tin, lead or alloy of tin and lead.

The semiconductor chip 36, such as VLSI, is mounted in flip-chip manner on the surface of the board 38 with a circuit side, where external electrode terminals are provided, of the semiconductor chip 36 facing down toward the surface of the board 38. Solder bumps (not shown) for the external electrodes of the semiconductor chip 36 and the C4 bumps 46 of the board 38 are soldered together. The flip-chip implementation is superior in an electric characteristic since it has shorter wiring than wire bonding, and it can handle high-speed computing and high-density implementation. The flip-chip implementation is also superior in heat radiation performance because the heat can be dissipated from upper side opposite to the circuit side of the semiconductor chip.

A gap between the semiconductor chip 36 and the board 38 is filled with underfill material. With this, the stress generated from the soldered joint between the bumps is dispersed by the underfill material. Therefore, the deformation of the package substrate 30 is relaxed, thereby improving the resistance performance of the package substrate against temperature change.

A sealing resin is formed around the periphery of the semiconductor chip 36 for sealing the semiconductor chip 36. In this embodiment, the sealing resin 32 is formed so that the upper side opposite to the circuit side of the semiconductor chip 36 is exposed. As discussed below, it is preferable that the upper side of the semiconductor chip 36 protrudes slightly against an upper side of the sealing resin 32 in order to decrease the heat resistance caused by the contact between the semiconductor chip 36 and the heat radiator. Molding the semiconductor chip with resin as such may improve the heat transfer emitted from the semiconductor chip 36 and also may strengthen the rigidity of the board 38.

A plurality of fixing members 34 are installed at the respective corners of the package substrate 30. The fixing member 34 comprises a hook 40 extending above the upper side of the semiconductor chip 36, a buried part 44 buried in the sealing resin 32, and a pole 42 connecting the hook 40 and the buried part 44. The fixing member 34 is a member to fix a separate component, such as a spreader, which will be described later with reference to FIG. 2, on the side of the package substrate 30 where the semiconductor chip 36 is mounted, thereby pressing the semiconductor chip 36 between the separate component and the board 38.

The package substrate 30 is produced using the following procedure. First, the board 38 having a multilayered wiring structure is manufactured. Then the semiconductor chip 36 is mounted on the board 38. The semiconductor chip 36 and the fixing members 34 are sealed with sealing resin. Finally, the BGA balls 48 and other parts are implemented on the back side of the board 38.

Next, formation of the sealing resin is roughly described. An upper die and a lower die are provided. The upper die and the lower die have a cavity, respectively. The cavity is a space where the sealing resin is formed when the dies are matched. The upper die comprises a runner for flowing the melted sealing resin and has a structure for holding the fixing member. The runner has an opening into the cavity. A partition surface of the upper die comes to contact with the upper side of the semiconductor chip 36. On the other hand, the lower die comprises a pot having a reciprocatory movable plunger.

After setting up the upper die and the lower die described above, the substrate with the semiconductor chip is placed on the lower die. Then, resin tablets, which are solidified sealing resin, are put into the pot. The upper die and the lower die are matched and then clamped. The resin tablets are heated and become melted. Subsequently, the liquid sealing resin is introduced into the cavity by pushing the plunger into the pot, thereby the cavity being filled up with the sealing resin. Then, the sealing resin is cooled and solidified. The upper die and the lower die are separated, and the board having formed sealing resin is detached from the dies.

According to the process for forming the sealing resin, the sealing resin 32 is formed around the periphery of the semiconductor chip 36 for sealing the chip 36, and the upper side of the semiconductor chip 36 is exposed. Additionally, the fixing members 34 are buried in the sealing resin 32.

Figure 2A:
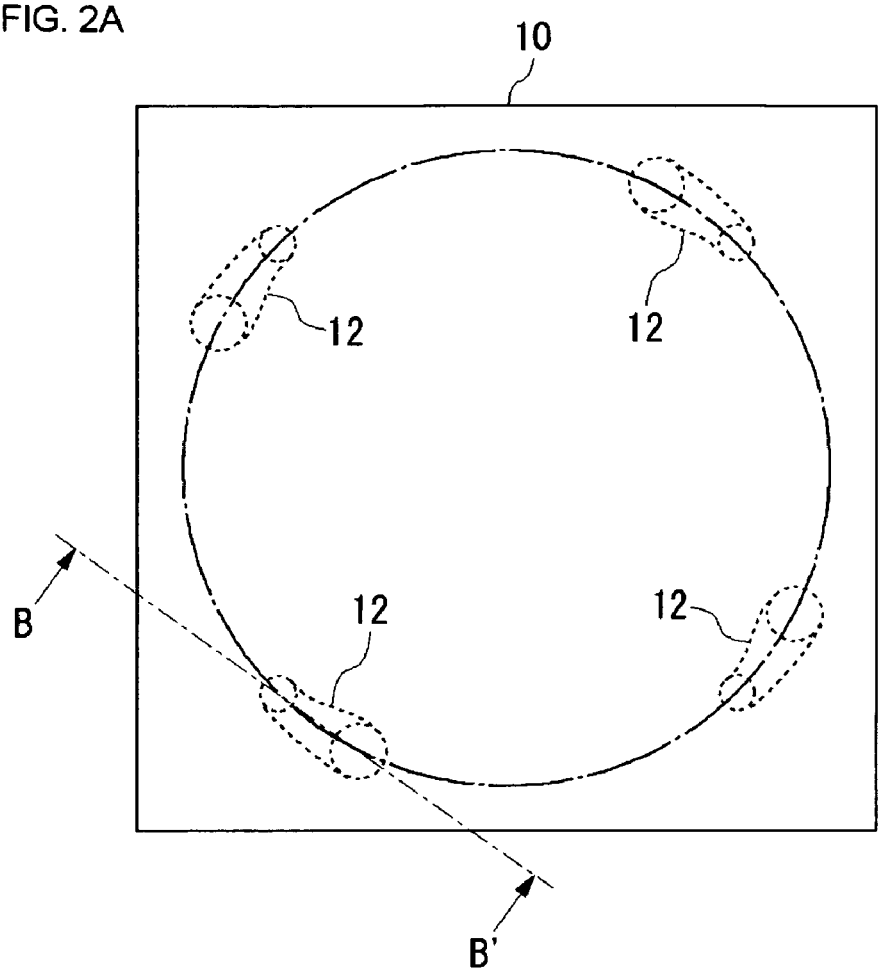
FIG. 2A is a plane view of a spreader according to one embodiment of the invention.
Figure 2B:
FIG. 2B is a front view of the spreader shown in FIG. 2A.
Figure 2C:
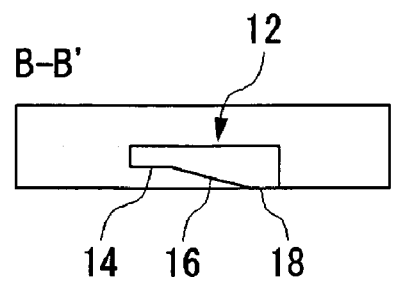
FIG. 2C is a cross-sectional view along line B-B' of the spreader in FIG. 2A.

FIG. 2A is a plane view of a spreader 10 according to one embodiment of the invention. FIG. 2B is a front view of the spreader 10. FIG. 2C is a cross-sectional view along line B-B' of the spreader 10. In the four corners of the bottom surface of the spreader 10, respective guiding slots 12 are formed. The position of the guiding slots 12 and that of the fixing members 34 are corresponded one to one. The guiding slots 12 are positioned along the circle which is centered at the center of the spreader 10. The guiding slot 12 serves to lead the hook 40 of the fixing member 34 within the slot itself. As shown in FIG. 2C, the guiding slot 12 comprises an insertion part 18 where the hook 40 is inserted, a fitting part 14 formed to receive the hook 40 and fit, and a slope part 16 connecting the insertion part 18 and the fitting part 14. The slope part 16 has a smooth slope, and the direction of the slope follows the circle shown in FIG. 2A.

The spreader 10 is preferably made of a material having high heat conductivity, such as copper, silver, carbon fiber, graphite, diamond, or CNT composites. The spreader 10 is fixed so that the side where the guiding slots 12 are formed faces the semiconductor chip 36, and dissipates heat emitted from the semiconductor chip 36.

Figure 3A:
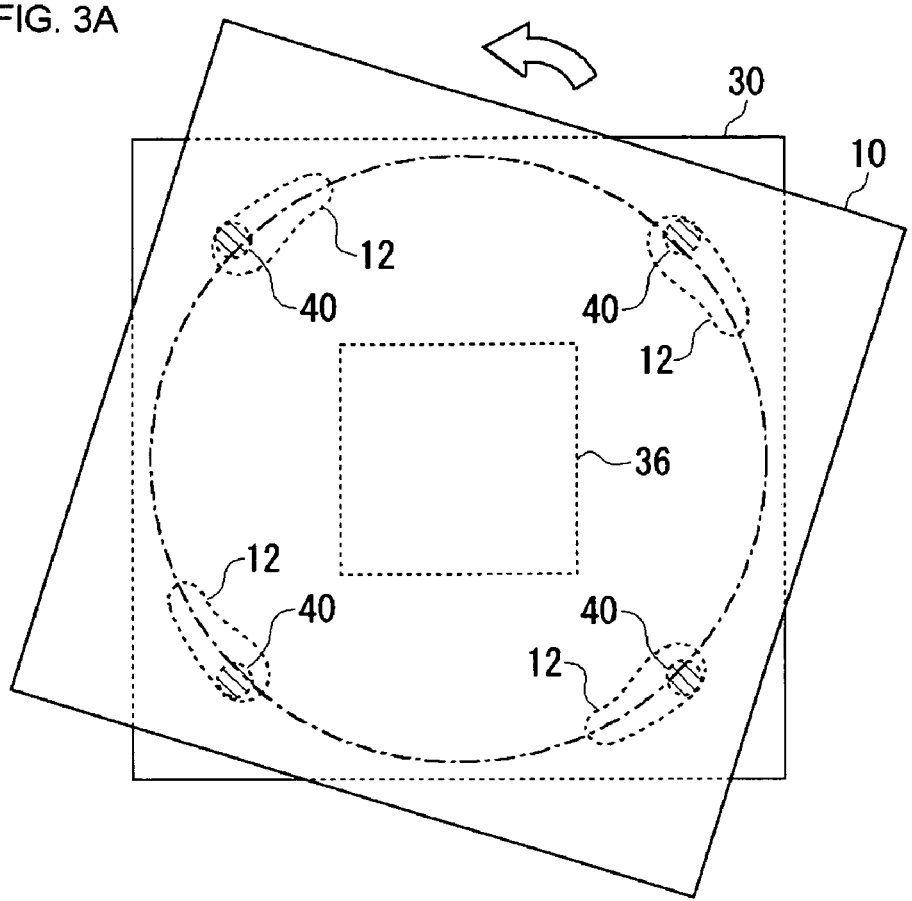
FIGS. 3A and 3B show how to assemble the spreader to the package substrate.
Figure 3B:
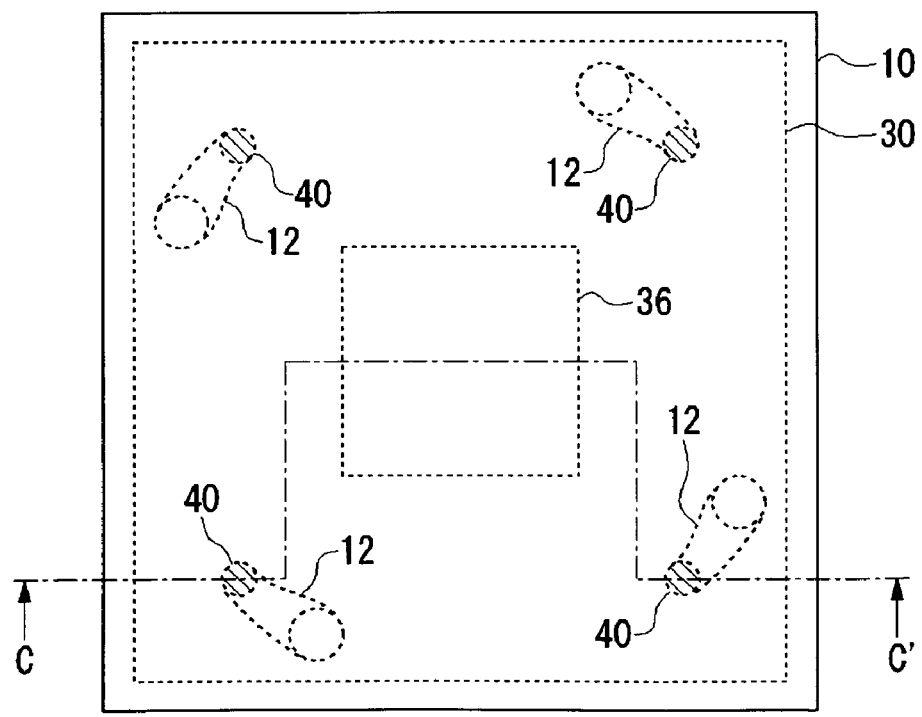

FIGS. 3A and 3B show how to assemble the spreader 10 to the package substrate 30. First, as shown in FIG. 3A, the hooks 40 of the fixing members 34 are inserted into the respective insertion parts 18 of the spreader 10. The insertion part 18 is formed to have a slightly larger cross-section area than that of the hook 40, so it is easy to align the four fixing members 34 to the four insertion parts 18. The insertion parts 18 are disposed on the circle same with the circle for alignment of the fitting parts 14. The insertion parts 18 are positioned in regard to the fitting parts 14 with some degree rotation. Therefore, when the hooks 40 are inserted into the insertion parts 18 as shown in FIG. 3A, edges of the spreader 10 are angled against edges of the package substrate 30.

Then, the spreader 10 is rotated against the package substrate 30 with a predetermined degree until one edge of the spreader 10 becomes generally parallel to one edge of the package substrate 30. By this rotation, the hook 40 of the each fixing member 34 slides over the slope part 16 of the guiding slot 12. Finally, the hook 40 of the each fixing member 34 enters into the fitting part 14. FIG. 3B shows the fitting state of the hook 40 and the fitting part 14. The fitting part 14 preferably has a small projection on its entrance for locking the hook 40 after the hook 40 is received in the fitting part 14, thereby preventing the loosening of the spreader 10.

Figure 4:
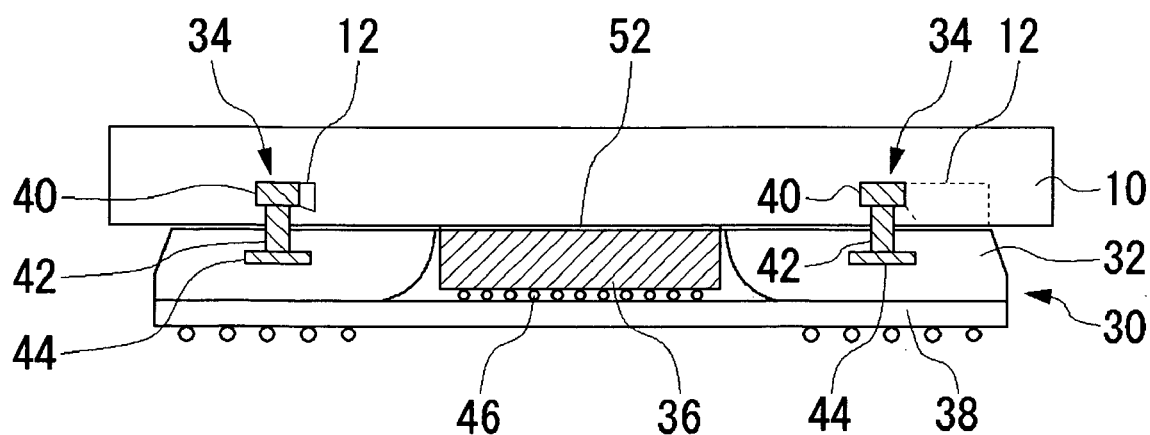
FIG. 4 is a cross-sectional view of the spreader and the package substrate shown in FIG. 3B.

FIG. 4 is a cross-sectional view along line C-C' in FIG. 3B of the spreader 10 and the package substrate 30 after installation. In FIG. 4, heat emitted from the semiconductor chip 36 is transferred from the upper side of the chip 36 to the spreader 10, and dissipated from the upper side of the spreader 10. In case that heat radiation amount is relatively large, cooling air may be sent to the spreader 10 by an electric fan or other device.

As shown, the fitting part 14 has a depth such that, when the hook 40 and the fitting part 14 are fit, appropriate pressure can be applied onto the semiconductor chip 36 by the lower side of the spreader 10. Thus, appropriate pressure to the semiconductor chip may be realized through the simple movement of relative rotation of the spreader in regard to the package substrate. The appropriate pressure on the chip makes the heat resistance between the chip and the board uniform, thereby improving the heat radiation performance.

In conventional art, the spreader is stuck to the semiconductor chip using adhesion seat or so. When sticking the spreader to the semiconductor chip as such, it is possible that excessive load or uneven load is applied on the semiconductor chip, thereby degrading the reliability of the soldered joint or semiconductor chip itself. In this embodiment, such excessive load or uneven load may be avoided by machining the guiding slots and the fixing members to have appropriate geometry.

Preferably, a TIM (thermal interface material) 52 may be provided between the upper side of the semiconductor chip 36 and the lower side of the spreader 10. With the TIM, heat transfer from the semiconductor chip 36 to the spreader 10 becomes equalized. Therefore, local elevation of temperature of the semiconductor chip 36 may be depressed, thereby improving the running stability of the chip 36.

In general, the larger the surface area of the spreader 10 is than upper side area of the semiconductor chip, the higher the heat radiation performance of the spreader becomes. As shown in FIGS. 3A and 3B, there are many cases that the surface area of the spreader 10 is larger than that of the package substrate 30. In such a case, it is difficult to attach the spreader to the package substrate because a worker cannot view the surface of the package substrate when attaching. In this embodiment, the worker can align the spreader 10 against the package substrate 30 only by matching the hooks 40 of the fixing members 34 to the insertion parts 18 having larger inlet than the hook 40. Then, the worker only needs to rotate the spreader 10 against the package substrate 30 for attachment. Therefore, it is easy to attach the spreader to the package substrate. In addition, by rotating the spreader 10 against the package substrate 30 in direction that is opposite to the direction when attaching the spreader, the user can easily detach the spreader 10 from the package substrate. Therefore, it is easy to replace the spreader or the package substrate in case that one of them is turned out to be defective.

FIG. 5A is a cross-sectional view of the spreader 10 and a package substrate 70 with a stiffening plate 76 buried in a sealing resin 32 when they are joined together. FIG. 5B is a plane view of the package substrate 70 with the spreader 10 removed from the substrate. The stiffening plate 76 is buried inside of the sealing resin 32. The stiffening plate 76 is thinner than the semiconductor chip 36 and having a shape surrounding the periphery of the semiconductor chip 36. It is desirable for the stiffening plate 76 to cover the board 38 to outer edge. With the stiffening plate 76, strength of the board 38 may be improved. Accordingly, deformation of the board 38 may be decreased due to the stiffening plate 76 when the spreader 10 is attached to the package substrate 70 using the fixing members 74. Fixing members 74 may be joined to the stiffening plate 76. With this, when the spreader 10 is attached to the package substrate 70 using the fixing members 74, fracture of the sealing resin 32 may be prevented by excessive load because the load is received by the stiffening plate 76. The stiffening plate 76 may relax the distortion of the package substrate due to the heat expansion and may dissipate heat emitted from the semiconductor chip.

Figure 6A:
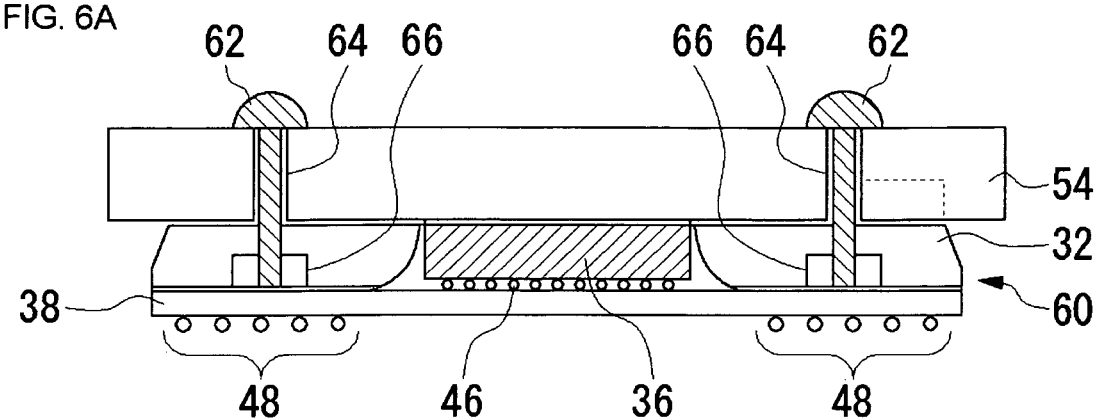
FIG. 6A is a cross-sectional view of the spreader and the package substrate when they are joined together according to another embodiment of the invention.
Figure 6B:
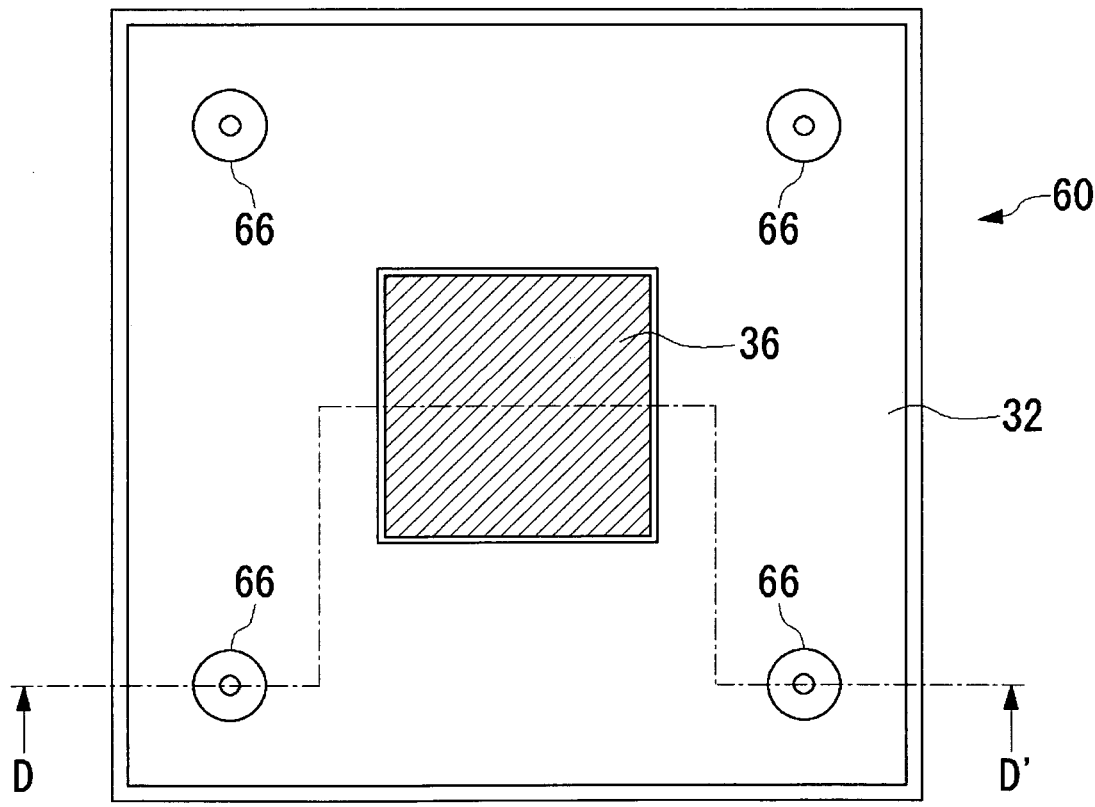
FIG. 6B is a plane view of the package substrate with the spreader removed from the substrate shown in FIG. 6A.

FIG. 6A is a cross-sectional view along D-D' line in FIG. 6B of a spreader 54 and a package substrate 60 when they are joined together according to another embodiment of the invention. FIG. 6B is a plane view of the package substrate 60 with the spreader 54 removed from the substrate. The spreader may be fixed with push-fit pins or screws in addition to rotary locking structure as described with reference to FIGS. 3A, 3B and 4. In such a case, a plurality of through-holes 64 is formed in the spreader 54 as shown in FIG. 6A. A plurality of fixing members 66 are provided in the sealing resin 32 of the package substrate 60 for receiving respective joint members 62 at the positions corresponding to the through-holes 64 in the spreader 54. The spreader 54 is attached to the package substrate 60 by fixing the joint members 62 to the fixing members 66 on the substrate 60 via the through-holes 64, respectively. If the joint member 62 is a push-fit pin, then the fixing member 66 is a hole having a bottom. The depth of the hole is preferably designed so that the pressure to the semiconductor chip 36 by the spreader 54 is properly when the push-fit pin is inserted to the bottom of the hole. If the joint member 62 is a screw, then the fixing member 66 is a nut. In such case, the length of the screw is preferably designed so that the pressure to the semiconductor chip 36 by the spreader 54 is properly when the screw is fastened to the nut to its end. As is the case with FIG. 4, the fixing members 66 may be joined to the stiffening plate 76 provided in the sealing resin 32.

According to another embodiment, push-fit pins may be vertically arranged on the package substrate. In this case, a plurality of holes having bottoms for receiving the push-fit pins are formed in the spreader at the position corresponding to the push-fit pins on the package substrate. After aligning the push-fit pins to the holes with bottoms, the user pushes the spreader toward the package substrate, thereby fitting the push-fit pins into the holes. Then, the spreader is fixed to the package substrate. In another embodiment, screws may be vertically arranged in the package substrate. In this case, through-holes are formed in the spreader at the position corresponding to the screws arranged in the package substrate. After inserting the screws into the through-holes, the user fastens the screws with nuts, thereby fixing the spreader to the package substrate. As is the case with FIG. 4, the fixing members 66 may be joined to the stiffening plate 76 provided in the sealing resin 32.

Figure 7:
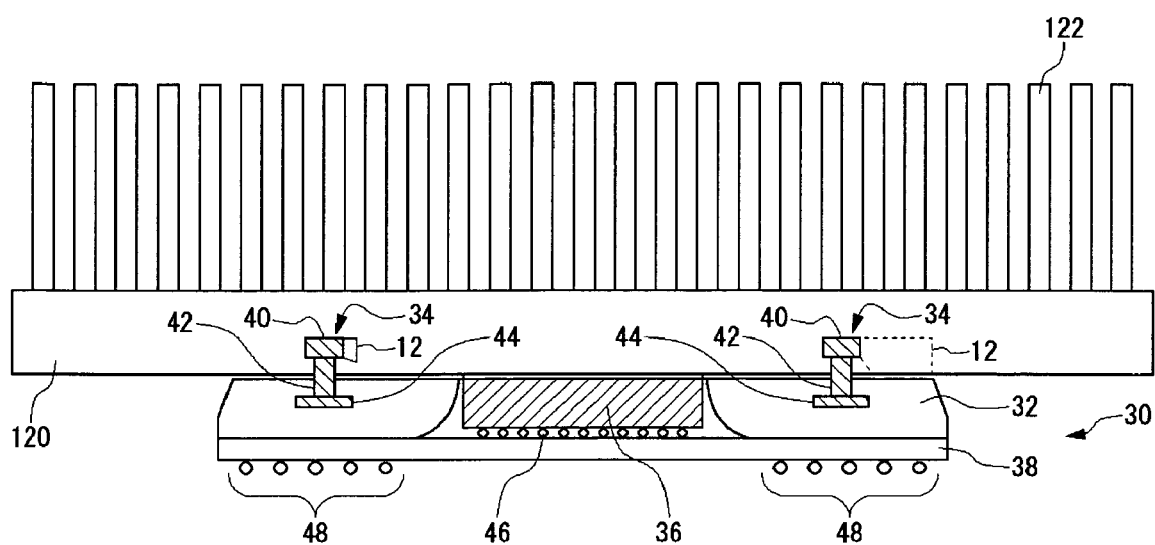
FIG. 7 is a cross-sectional view of the package substrate with a heat sink mounted thereon according to one embodiment of the invention.

A heat sink may be used as heat radiator for the semiconductor chip 36 instead of the spreader. FIG. 7 is a cross-sectional view of the package substrate 30 with a heat sink 120 mounted thereon having a plurality of fins 122. Guiding slots 12 are formed on lower surface of the heat sink 120. With the guiding slots 12, the heat sink 120 may be fitted to the hooks 40 of the fixing members 34 provided on the package substrate 30. Heat emitted from the upper side of the semiconductor chip 36 is transferred to the heat sink 120. The heat sink 120 has large heat exchange surface exposed to atmosphere. By sending cooling air to the heat sink using an electric fan (not shown), hot air resided near the exchange surface of the heat sink may be effectively removed.

If the size of the heat sink 120 is much larger than that of the semiconductor chip 36, a spreader made of copper or the like may be provided between the semiconductor chip 36 and the heat sink 120 so as to transfer heat from the chip 36 to the heat sink more effectively. In this case, the length of the pole 42 of the fixing member 34 is designed in consideration of the thickness of the spreader.

As described above, according to the embodiments, the heat radiator may be easily and reliably attached to the package substrate using the rotary locking structure. Therefore, assembly time may be shortened. If machining accuracy of the fixing members and the guiding slots is high enough, high assembling accuracy of the heat radiator to the package substrate may be realized without skilled worker, enabling automatic assembly with high reliability for implementation to the substrate. Accordingly, manufacturing cost of semiconductor devices may be reduced.

By contacting the heat radiator such as the spreader to the upper side, opposite to the circuit side, of the semiconductor chip which is flip-chip implemented to the package substrate, efficiency of the heat radiation may be improved. Contacting area between the semiconductor chip and the heat radiator is increased due to the high assembling accuracy. Then, heat resistance between the semiconductor chip and the heat radiator may be decreased, thereby improving the efficiency of heat radiation.

The semiconductor device has the fixing members provided on the package substrate. With the fixing members, various types of the heat radiator may be used as modular unit which can be attached to the package substrate. Therefore, it become possible to attach to the package substrate a desirable heat radiator among existing ones such as a spreader, a heat sink or a cooling head in accordance with the amount of heat emitted from the semiconductor chip. Chip vender does not need to deliver package substrates with heat radiators such as a spreader attached thereon, because the heat radiator can be easily attached on the substrate by an assembly maker. Thus, the chip vender may reduce assembling cost. The assembly maker may combine suitable heat radiator to the package substrate according to the amount of heat emitted from the semiconductor chip. Thus, the assembly maker may have a high degree of flexibility in assembling the semiconductor device.

Suppose that, after the chip vendor assembles the package substrate and the heat radiator and then conducts a test to prove the semiconductor device, the chip vendor delivers the package substrate and the heat radiator to the assembly maker separately. In such a case, since it is easy to disassemble the heat radiator from the package substrate, the working time for disassembling may be reduced. The chip vendor can deliver the package substrate and the heat radiator to the assembly maker separately. This reduces the volume and weight of a package, decreasing the transportation cost. The assembly maker can disassemble the heat radiator from the package substrate easily. Then, if any of the heat radiator or the package substrate turns out to be defective after assembling, the assembly maker need not throw away a whole of the semiconductor device. The assembly maker can reuse the heat radiator or the package substrate which is not defective.

Downsizing, speeding-up, and high-densification of the semiconductor device causes an increase of power consumption, and heating-value per unit volume tends to increase. Thus, in order to ensure computing stability of the semiconductor device, there is a need to improve the radiation performance of the semiconductor device. So, the size of the heat radiator such as a spreader and a heat sink become larger. In general, it is not desirable to attach a massive heat radiator on the package substrate. However, as described above, providing the stiffening plate in the sealing resin relaxes the deformation of the board due to the attachment of the heat radiator. When using the stiffening plate, it is needless to stick a back plate on a backside of the board.

The description of the invention given above is based upon the embodiments. The description of the embodiments is illustrative in nature and various variations in constituting elements and processes involved are possible. Those skilled in the art would readily appreciate that such variations are also within the scope of the present invention. Some examples of such variations will be described below.

It has been described that heat emitted from the semiconductor chip is removed using air cooling system with the spreader or the heat sink according to the embodiment. However, the spreader may be cooled with cooling water. The spreader may also comprise forced cooling elements therein. With the forced cooling element, the spreader may be downsized. Now some examples of forced cooling mechanism applied to the spreader will be described.

Figure 8A:
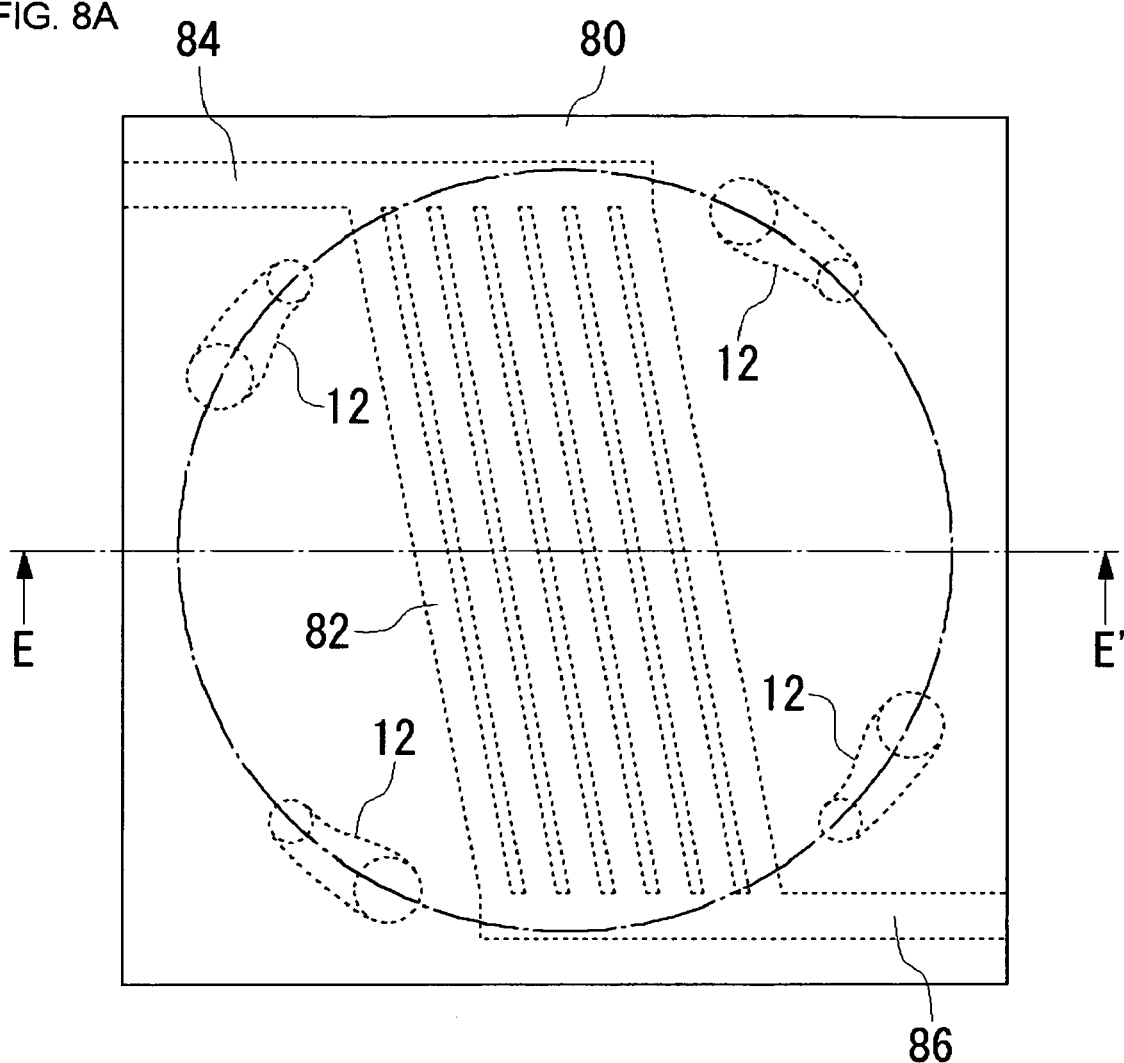
FIG. 8A is a plane view of a spreader with micro channels formed therein.
Figure 8B:
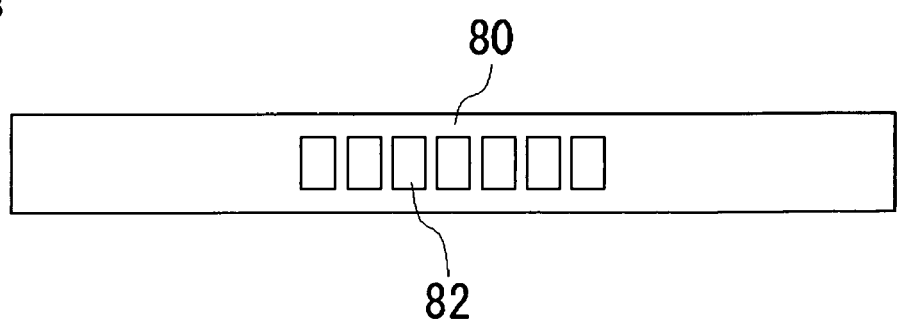
FIG. 8B is a cross-sectional view of the spreader shown in FIG. 8A.

FIG. 8A is a plane view of a spreader 80 with a plurality of micro channels formed therein. FIG. 8B is a cross-sectional view along E-E' line in FIG. 8A of the spreader 80. In the spreader 80, liquid or gas refrigerant supplied from a cooling apparatus (not shown) or supplied without a cooling apparatus flows in the micro channels 82 through refrigerant supply passage 84. This refrigerant forces out heat emitted from the semiconductor chip from the spreader 100. The refrigerant is recovered through other-side refrigerant supply passage 86. In case of liquid refrigerant, refrigerant warmed by heat emitted from the semiconductor chip may be recovered by well-known capillary force. In case of liquid or gas refrigerant, warmed refrigerant may be recovered by motive energy such as an electric pump. The recovered refrigerant is cooled by outer air or supplied to the cooling apparatus.

Figure 9A:
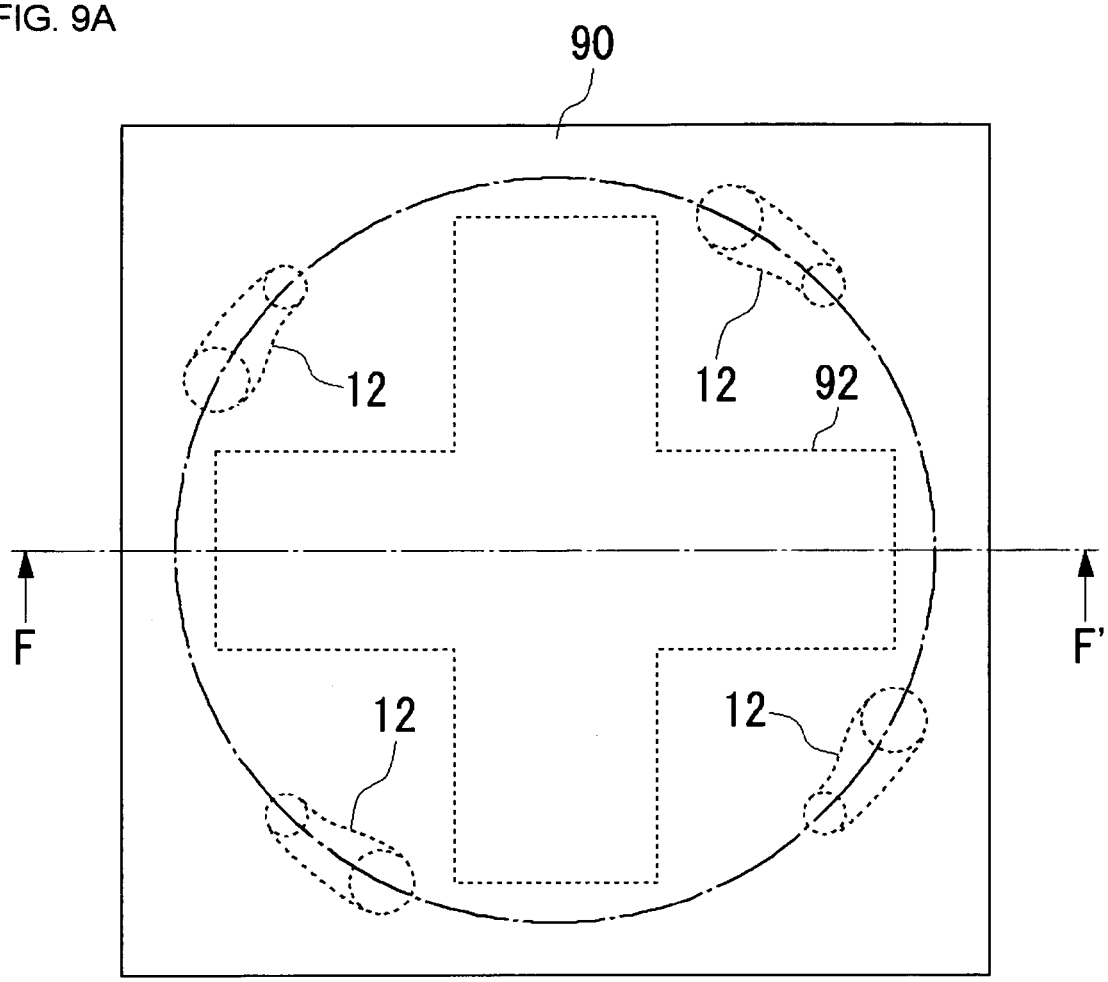
FIG. 9A is a plane view of a spreader with heat diffusion space formed therein.
Figure 9B:
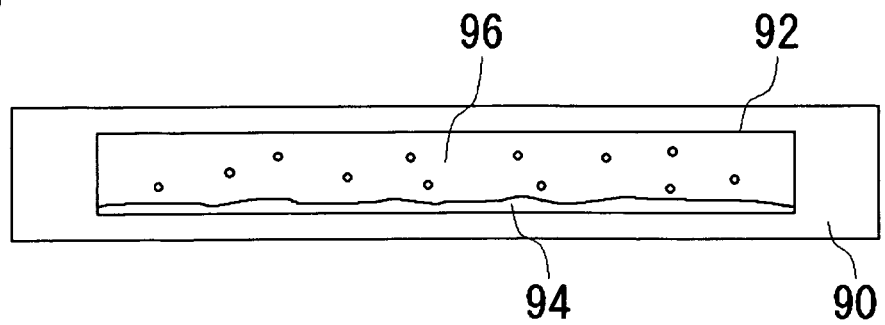
FIG. 9B is a cross-sectional view of the spreader shown in FIG. 9A.

FIG. 9A is a plane view of a spreader 90 with sealed spaces 92 for heat diffusion formed therein. FIG. 9B is a cross-sectional view along F-F' line in FIG. 9A of the spreader 90. A lower surface of the spreader 90 is a heat receiving side and an upper surface of the spreader 90 is a heat radiation side. Heating medium is enclosed within the sealed space 92. The spreader 90 is attached to the package substrate so that the lower surface of the spreader 90 comes to contact with the upper side of the semiconductor chip. Heating medium is vaporized on the heat receiving side by the heat emitted from the semiconductor chip, and both liquid phase 94 and gas phase 96 moves to the heat radiation side with heat by expansion of the gas phase. The liquid phase 94 and the gas phase 96 are cooled on the heat radiation side. Then the gas phase contracts and cooled liquid phase returns to the heat receiving side. Through such process, heat emitted from the semiconductor chip is transported and the chip is cooled.

Figure 10:
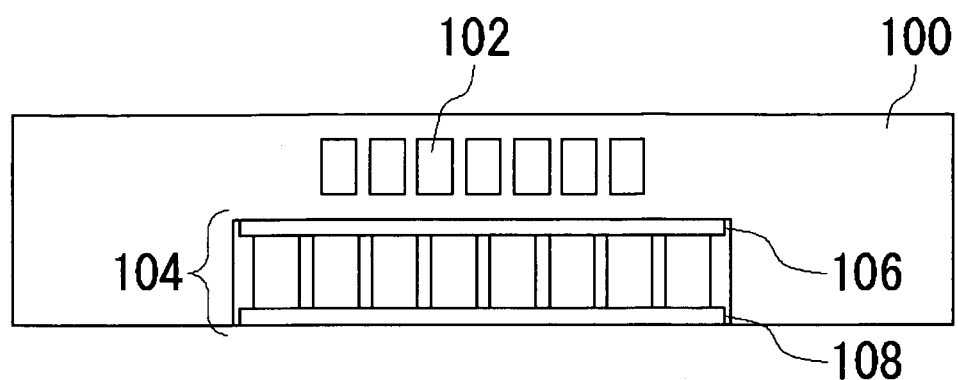
FIG. 10 is a cross-sectional view of a spreader wherein a Peltier element is incorporated inside the spreader.

FIG. 10 is a cross-sectional view of a spreader 100 wherein a Peltier element is incorporated therein. A Peltier element 104 is embedded under the micro channels 102 in the spreader 100 described with reference to FIG. 8. The spreader 100 is attached to the package substrate so that the Peltier element comes to contact with the upper side of the semiconductor chip. The "Peltier element" is a heat exchanging element having nature that one side of the element becomes cool and other side of the element becomes warm when direct-current electricity is applied to N-type and P-type semiconductor. The lower side 108 of the Peltier element 104 removes heat from the semiconductor chip and the upper side 106 of the Peltier element 104 passes the heat to the micro channels 102. Then the heat is transferred through the micro channels 102 by forced cooling.

The present invention is most effective in use with the flip-chip type package substrate, where heat is dissipated from the upper side of the semiconductor chip. However, the present invention may be applied to other package substrates using electric connecting type other than flip-chip between the semiconductor chip and the package substrate. For example, the present invention may be applied to wire-bonding type substrate where the circuit side of the semiconductor chip is exposed on upper side and electrodes are wired with gold wire. In this case, by filling up wire-bonding part with resin, heat emitted from the chip may be transported more effectively. Then, an upper face of the resin filling the wire-bonding part is shaped to be flat. The heat radiator is attached to the flat upper face of the resin according to the embodiment described above. Cooling efficiency of such package will be lower than that of the flip-chip type package. However, other advantage such as easy assembling is same as the embodiment described above.

It has been described that the fixing members are provided on the package substrate and the semiconductor chip is pressed between the package substrate and the heat radiator. However, the fixing members may be provided on an implementation substrate according to another embodiment of the invention. In this case, the semiconductor chip is pressed between the implementation substrate and the heat radiator.

Figure 11:
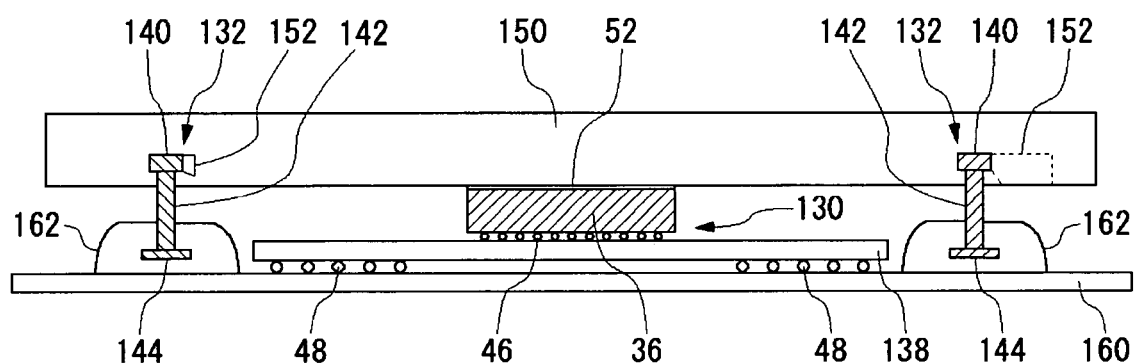
FIG. 11 is a cross-sectional view of an implementation substrate and a heat radiator in case that the semiconductor chip is sandwiched between them according to another embodiment of the invention.

FIG. 11 is a cross-sectional view of an implementation substrate 160 and a heat radiator in case that the semiconductor chip 36 is sandwiched between them according to another embodiment of the invention. As is case with FIG. 1, the semiconductor chip 36 is mounted on a board 138 in flip-chip manner. Circuit side of the chip 36 faces down on the board 138 and heat is dissipated from an upper side opposite to the circuit side of the chip 36. The package substrate 130 is mounted on the implementation substrate 160 using BGA balls 48. Resin bank 162 is formed on the implementation substrate 160. A fixing members 132 comprises a hook 140, buried part 144 buried in the resin bank 162, and a pole 142 connecting the hook 140 and the buried part 144. The pole 142 is designed so that the hook 140 extends above the upper side of the semiconductor chip 36.

After mounting the package substrate 130 on the implementation substrate 160, a heat radiator such as the spreader 150 is fixed to the implementation substrate 160 so that the semiconductor chip 36 is pressed between the spreader 150 and the package substrate 130 in the side where the chip 36 is mounted on the substrate 130. More specifically, as is the case with FIGS. 3A and 3B, the hook 140 of the fixing member 132 is inserted into the guiding slot 152 formed on the side facing the implementation substrate 160 of the spreader 150 for positioning. Then, the spreader 150 is rotated against the implementation substrate 160 with a predetermined degree. By this rotation, the hook 140 moves along the guiding slot 152, thereby pressing the spreader 150 to the semiconductor chip 36. According to this process, positioning and fixation of the heat radiator become easy, improving working efficiency for assembling substrates. The heat radiator may be fixed to the implementation substrate using joint member other than the rotary locking system as described in reference to FIGS. 6A and 6B.

When the package substrate is attached to or detached from the implementation substrate, heat is applied to a backside of the implementation substrate in order to melt solder. However, if this heating is applied to the implementation substrate attached with the heat radiator, applied heat is transferred from the implementation substrate via the sealing resin to the heat radiator, where the heat is dissipated. Thus, it would take long time until solder is melted. This causes fracture of the semiconductor chip due to applied heat. According to the embodiment, the heat radiator may be disassembled from and attached to the implementation substrate easily. Therefore, when the heat radiator is detached from the implementation substrate before applying heat to the substrate, problem described above will not occur.

As is the case with the embodiments described above, a stiffening plate may be embedded in the resin bank 162 on the implementation substrate 160 and the fixing members may be joined to the stiffening plate. The fixing members may be provided on the implementation substrate 160 using materials other than the resin.

What is claimed is:

1. A semiconductor device, comprising:
   a package substrate equipped with a semiconductor chip thereon,
   a sealing resin formed on the package substrate for sealing around a periphery of the semiconductor chip, and
   a plurality of fixing members for fixing a separate component on a side of the package substrate where the semiconductor chip is equipped, so that the semiconductor chip is pressed between the package substrate and the separate component, wherein:

each of the fixing members have a hook formed on the tip thereof and extending above the upper side of the semiconductor chip, and one end of each of the fixing members is buried in the sealing resin such that the fixing members are buried in the sealing resin along a circle, a plurality of guiding slots for guiding the hooks inside the separate component along the circle are provided on a side of the separate component facing the package substrate in such a way as to face the hooks, each guiding slot corresponding to a respective fixing member, and a rotary locking structure is provided, whereby the hook of each of the fixing members is inserted into the respective guiding slot, the separate component is rotated by a predetermined angle with respect to the package substrate along a concentric circle, and the hook of each of the fixing members travels inside the respective guiding slot, so that the separate component is pulled into contact with the semiconductor chip.

2. The semiconductor device according to claim 1, further comprising a stiffening plate buried in the sealing resin to surround the periphery of the semiconductor chip, wherein the stiffening plate is thinner than the semiconductor chip.

3. The semiconductor device according to claim 2, wherein the fixing member is joined to the stiffening plate.

4. The semiconductor device according to claim 1, wherein:
the semiconductor chip is disposed on the package substrate with a circuit side thereof facing the package substrate such that heat is dissipated from an upper side of the semiconductor chip, opposite to the circuit side, and
the sealing resin sealing around the periphery of the semiconductor chip is disposed so that the upper side of the semiconductor chip is exposed to an atmosphere.

5. The semiconductor device according to claim 1, wherein: the fixing member is formed so as to receive a joint member to fix the separate component to the package substrate, and the joint member extends through a hole formed in the separate component.

6. The semiconductor device according to claim 1, wherein the separate component is a heat radiator to dissipate heat emitted from the semiconductor chip.

7. A semiconductor device, comprising:
a package substrate equipped with a semiconductor chip thereon,
an implementation substrate equipped with the package substrate thereon, and
a plurality of fixing members for fixing a separate component on a side of the package substrate where the semiconductor chip is equipped, so that the semiconductor chip is pressed between the package substrate and the separate component, wherein:
each of the fixing members have a hook formed on the tip thereof and extending above the upper side of the semiconductor chip, and each of the fixing members is arranged on the implementation substrate such that the fixing members are buried in sealing resin on the implementation substrate along a circle,
a plurality of guiding slots for guiding the hooks inside the separate component along the circle are provided on a side of the separate component facing the package substrate in such a way as to face the hooks, each guiding slot corresponding to a respective fixing member, and
a rotary locking structure is provided, whereby the hook of each of the fixing members is inserted into the respective guiding slot, the separate component is rotated by a predetermined angle with respect to the package substrate along a concentric circle, and the hook of each of the fixing members travels inside the respective guiding slot, so that the separate component is pulled into contact with the semiconductor chip.

8. The semiconductor device according to claim 7, further comprising a stiffening plate fixed on the implementation substrate.

9. The semiconductor device according to claim 8, wherein the fixing member is joined to the stiffening plate.

10. The semiconductor device according to claim 7, wherein the semiconductor chip is disposed on the package substrate with a circuit side thereof facing the package substrate, and heat is dissipated from an upper side of the semiconductor chip, opposite to the circuit side.

11. The semiconductor device according to claim 7, wherein: the fixing member is formed so as to receive a joint member to fix the separate component to the implementation substrate, and the joint member extends through a hole formed in the separate component.

12. The semiconductor device according to claim 7, wherein the separate component is a heat radiator to dissipate heat emitted from the semiconductor chip.

13. The semiconductor device according to claim 1, wherein each of the guiding slots comprises an insertion part where the respective hook is inserted, a fitting part formed to receive the hook and fit, and a slope part connecting the insertion part and the fitting part and having a slope, wherein the respective hook slides along the slope part while in rotation so that the separate component is pulled into contact with the semiconductor chip.

14. The semiconductor device according to claim 7, wherein each of the guiding slots comprises an insertion part where the respective hook is inserted, a fitting part formed to receive the hook and fit, and a slope part connecting the insertion part and the fitting part and having a slope, wherein the respective hook slides along the slope part while in rotation so that the separate component is pulled into contact with the semiconductor chip.

* * * * *